(12) United States Patent
Haugan

(10) Patent No.: US 10,727,829 B2
(45) Date of Patent: Jul. 28, 2020

(54) POWER SUPPLY SYSTEM AND METHOD

(71) Applicant: Siemens Aktiengesellschaft, Munich (DE)

(72) Inventor: Espen Haugan, Trondheim (NO)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 16/476,283

(22) PCT Filed: Jan. 10, 2018

(86) PCT No.: PCT/EP2018/050541
§ 371 (c)(1),
(2) Date: Jul. 6, 2019

(87) PCT Pub. No.: WO2018/130558
PCT Pub. Date: Jul. 19, 2018

(65) Prior Publication Data
US 2019/0363628 A1  Nov. 28, 2019

(30) Foreign Application Priority Data
Jan. 13, 2017  (EP) .................... 17151371

(51) Int. Cl.
*H03K 17/0814* (2006.01)
*H02J 1/00* (2006.01)
(52) U.S. Cl.
CPC .......... *H03K 17/08148* (2013.01); *H02J 1/00* (2013.01)
(58) Field of Classification Search
CPC .............................. H03K 17/08148
See application file for complete search history.

(56) References Cited

U.S. PATENT DOCUMENTS 10,230,260 B2 * 3/2019 Cairoli .................... H02J 9/061
2003/0021131 A1   1/2003 Nadot et al.

FOREIGN PATENT DOCUMENTS

WO       2006024198 A1     3/2006

OTHER PUBLICATIONS

Hassanpoor, A., Häfner, J., & Jacobson, B. (2014). Technical assessment of load commutation switch in hybrid HVDC breaker. IEEE Transactions on power electronics, 30(10), 5393-5400. (Year: 2014).*

(Continued)

*Primary Examiner* — Daniel J Cavallari
(74) *Attorney, Agent, or Firm* — Beusse Wolter Sanks & Maire

(57) ABSTRACT

A DC power supply system has first and second DC power distribution bus sections and a DC power switching assembly has a plurality of series connected power switching units and a current limiter. Each power switching unit has a first and second power switching unit terminal and two symmetrical power switching sub-units to control current flow between. Each sub-unit is electrically connected on one side to one of the first and second power switching unit terminals and on the other side to the other sub-unit. The power switching sub-units each have a semiconductor device and in parallel with the semiconductor device, a series connected diode and capacitor. A first terminal of the assembly is electrically coupled to the first bus section and the second terminal is electrically coupled to the second bus section. The voltage at one side of the power switching assembly is greater than or equal to 1 kV.

9 Claims, 6 Drawing Sheets

(56) References Cited

OTHER PUBLICATIONS

Wikipedia contributors. "Series and parallel circuits." Wikipedia, The Free Encyclopedia. Wikipedia, The Free Encyclopedia, Mar. 15, 2020. Web. Mar. 24, 2020. (Year: 2020).*
International search report and written opinion dated Apr. 26, 2018 for corresponding PCT/EP2018/050541.

* cited by examiner

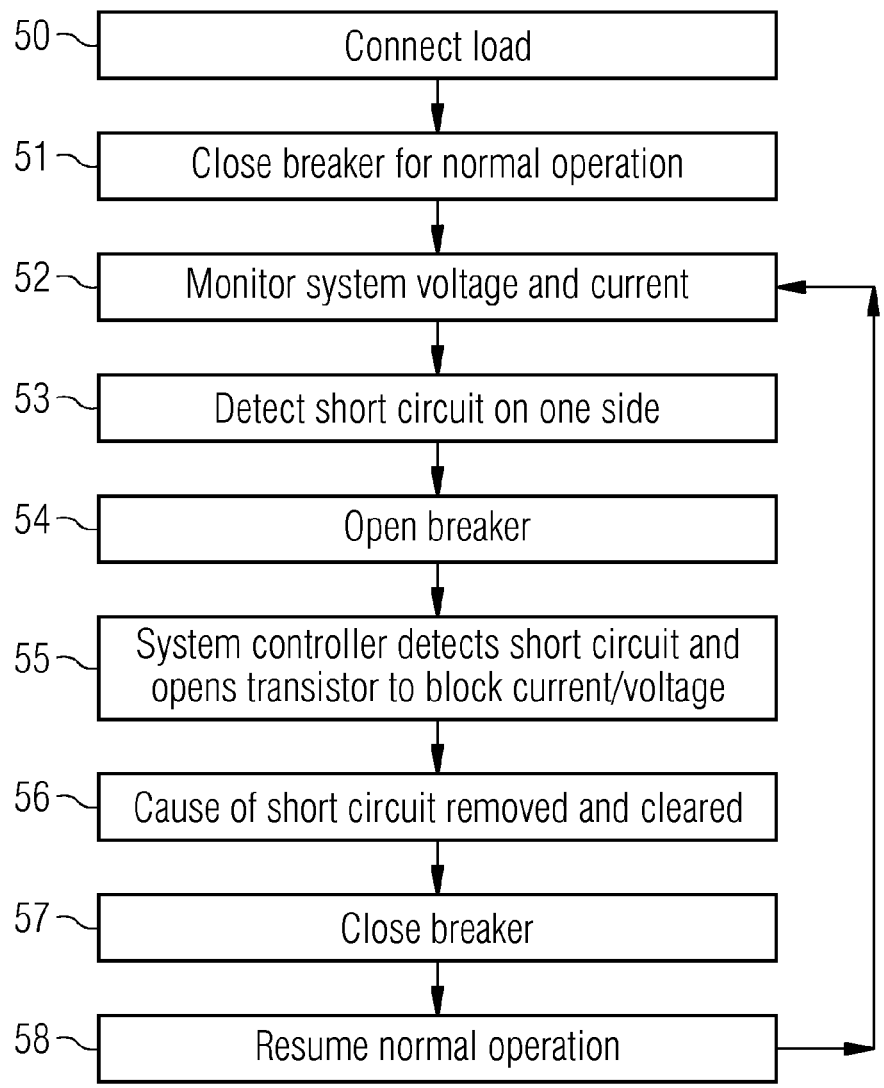

POWER SUPPLY SYSTEM AND METHOD

CROSS REFERENCE TO RELATED APPLICATIONS

This application is the US National Stage of International Application No. PCT/EP2018/050541 filed Jan. 10, 2018, and claims the benefit thereof. The International Application claims the benefit of European Application No. EP17151371 filed Jan. 13, 2017. All of the applications are incorporated by reference herein in their entirety.

FIELD OF INVENTION

This invention relates to a DC power supply system comprising a power switching assembly, in particular for an offshore platform or vessel.

BACKGROUND OF INVENTION

On offshore platforms or vessels, drilling rigs, aircraft, HVDC systems, wind power grids, or similar DC systems, much equipment is deemed to be critical and regulatory requirements specify the availability of power in the event of a fault. Consequentially, it has been normal practice to separate the equipment on the vessel, or rig, into sections and provide separate power to each section, with redundancy, so that if a fault occurs in one section, it does not transfer to the other and not all operational capability is lost. This separation has been achieved by operating with bus ties between the sections normally open and only in limited circumstances closing those bus ties to enable one side to receive power from the other. However, such bus ties are only available for low voltage DC systems. For high voltage systems, mechanical breakers must be used.

SUMMARY OF INVENTION

In accordance with a first aspect of the present invention a DC power supply system comprises first and second DC power distribution bus sections and a DC power switching assembly comprising a plurality of series connected power switching units and a current limiter; each power switching unit comprising a first power switching unit terminal and a second power switching unit terminal and two symmetrical power switching sub-units to control current flow between the first terminal and the second terminal; each sub-unit being electrically connected on one side to one of the first and second power switching unit terminals and on the other side to the other sub-unit; wherein the power switching sub-units each comprise a semiconductor device and in parallel with the semiconductor device, a series connected diode and capacitor; wherein a first terminal of the assembly is electrically coupled to the first bus section of the power distribution bus and the second terminal is electrically coupled to the second bus section of the power distribution bus; and wherein the voltage at one side of the power switching assembly is greater than or equal to 1 kV.

The power supply system disconnects the DC bus sections from one another, if a fault, such as a short circuit, is detected, in order to prevent a fault on one side of the system from propagating to the other side.

Typically, the current limiter comprises an inductance.

Advantageously, the current limiter is provided between each of the first and second terminals and an adjacent power switching unit.

This provides protection for the switching units from short circuits occurring on either side of the DC power distribution system.

Advantageously, one or each of the sub-units further comprises a resistor in series with the capacitor.

This helps to limit system oscillations. It is advantageous that each sub-unit comprises a resistor.

Advantageously, one or each of the sub-units further comprise a damping circuit in series with the capacitor.

This helps to limit system oscillations. It is advantageous that each of the sub-units comprises a damping circuit.

Advantageously, the semiconductor device comprises one of a diode, or a transistor.

Advantageously, the semiconductor device comprises an insulated gate bipolar transistor.

Advantageously, the voltage at one side of the power switching assembly is within the range 1 kV to 15 kV.

In accordance with a second aspect of the present invention, a method of operating a DC power supply system according to the second aspect comprises monitoring system voltage and current during operation; if a short circuit is detected, opening the power switching units to block current from the short circuit side of the system; monitoring for an indication that the short circuit has been cleared, closing the power switching units to allow current to pass through the power switching units; and continuing to monitor the system for indications of a short circuit.

BRIEF DESCRIPTION OF THE DRAWINGS

An example of a DC power supply system comprising a power switching assembly and method according to the present invention will now be described with reference to the accompany drawings in which:

FIG. 6 is a flow diagram of a method of operation of a DC power supply system comprising a power switching assembly according to the invention.

DETAILED DESCRIPTION OF INVENTION

DC power distribution systems on offshore vessels, or platforms, or remote drilling rigs, typically comprise a power source such as a prime mover, a generator, or an energy store, together with DC bus sections which are joined by a bus tie switch. In order to meet regulatory requirements for safe operation, the bus tie switch must be able to disconnect the DC bus sections from one another to prevent a fault on one side of the system from propagating to the other side and potentially losing all power to critical systems, such as thrusters or essential parts of the drilling equipment.

Typically, a bus tie switch or breaker function is provided for AC distribution (high and low voltage) solutions with mechanical breakers or low voltage DC distribution systems, typically up to 1000V DC, such as that shown in FIG.

1. Currently, there are limited options available for high voltage static DC switches for use in marine and offshore systems. High voltage equivalents, typically for operation at 10 to 15 kV or higher, are not available. Where two independently operating power systems are required to meet classification standards, there is a need for very fast disconnection of DC bus tie connections to prevent faults from propagating from one side to another. Existing low voltage bus tie switches are not able to operate at voltages above 1000V and certainly not for voltage in the region of 10 to 15 kV or higher.

Figure 1:
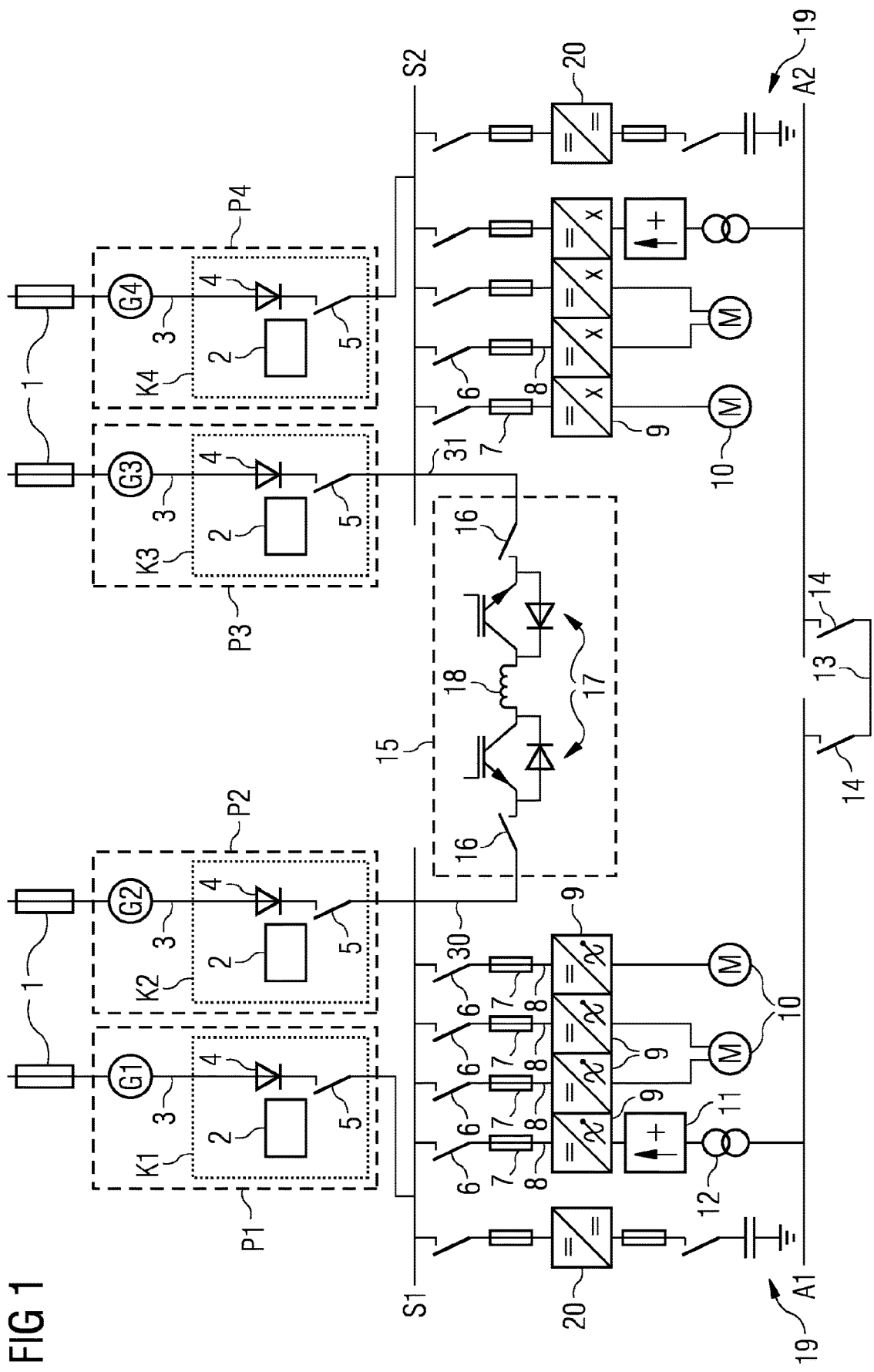
FIG. 1 illustrates an example of circuitry for a low voltage diesel electric propulsion system.

The example of FIG. 1 is a diesel electric propulsion system based on low voltage DC distribution and comprises a plurality of diesel engines 1, each connected to a generator G1, G2, G3, G4 within respective generator protections systems P1, P2, P3, P4. The generator protection systems include a generator cubicle K1, K2, K3, K4 incorporating generator control 2. Each generator is coupled to DC main switchboard S1, S2 via line 3 which includes a diode 4 and isolation switch 5. Generators G1 and G2 are coupled to switchboard S1. Generators G3 and G4 are coupled to switchboard S2. From each of the switchboard S1, S2, switches 6 and fuses 7 are provided in lines 8 to inverters 9 between the DC main switchboard and motors 10, or to a shaft generator with motor function, which is coupled to AC auxiliary switchboard A1, A2 via filter 11 and transformer 12. In addition, the DC main switchboard S1, S2 supplies a battery 19 through a DC to DC converter 20. The AC auxiliary switchboard is coupled via bypass 13 and isolation switches 14. The DC main switchboard is connected via bus tie switch 15 comprising an isolation switch 16 and transistor diode arrangement 17 at each side of a di/dt reactor 18.

The example of FIG. 1 may be adapted for high voltage DC distribution by replacing the bus tie switch 15 with a power switching assembly 122 as described hereinafter.

Figure 2:
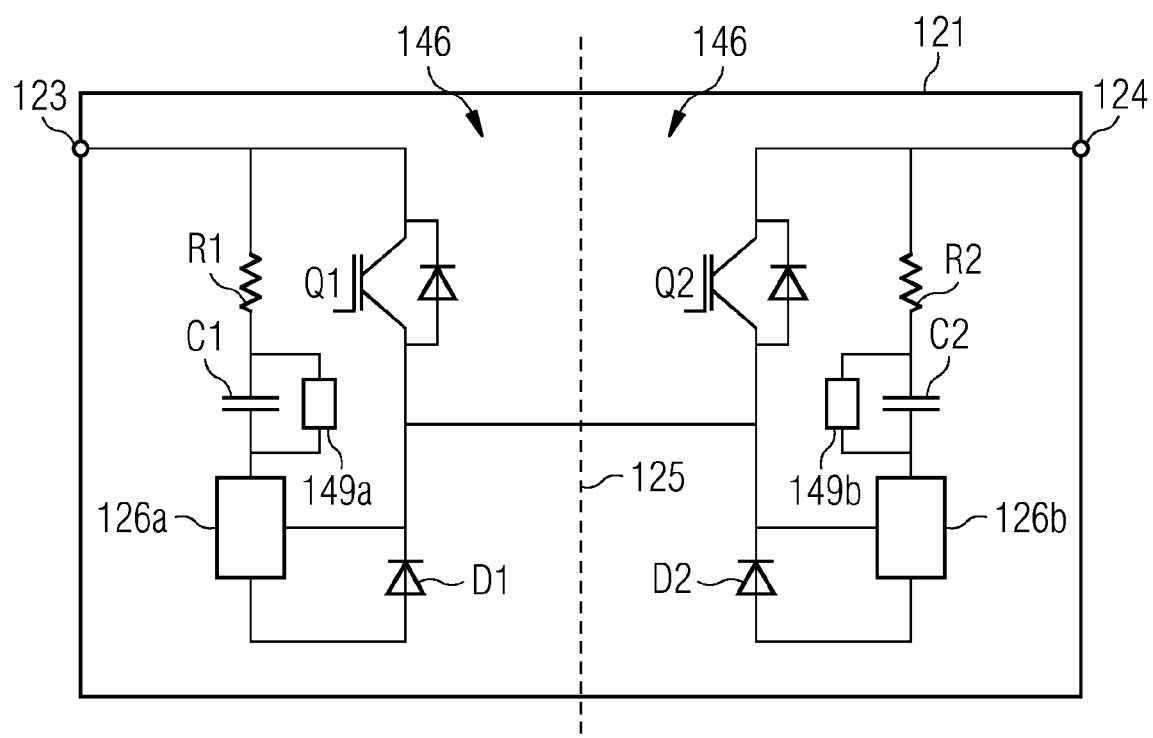
FIG. 2 illustrates an example of a power switching unit of a power switching assembly according to the invention.
Figure 3:
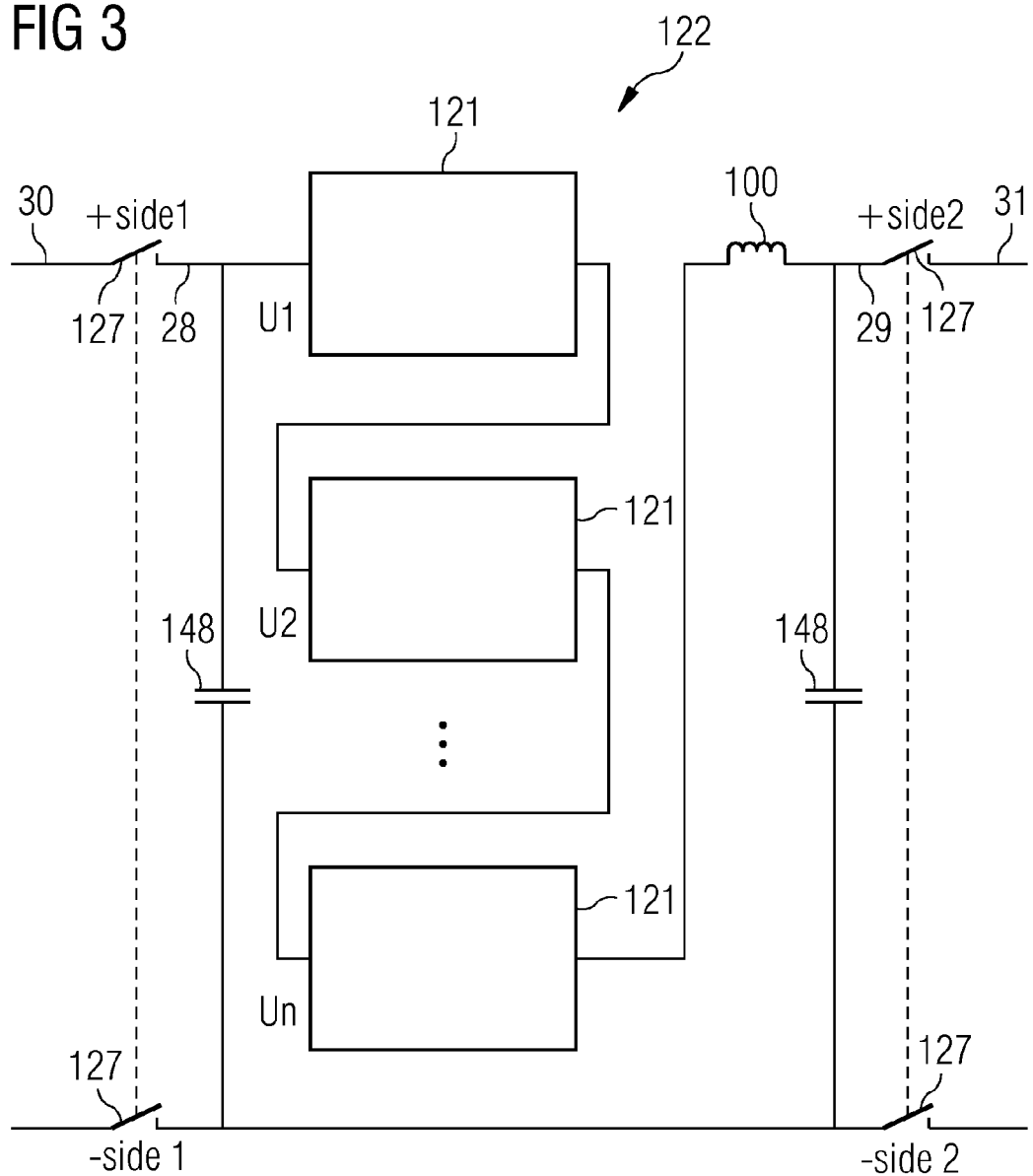
FIG. 3 shows an example topology of a power switching assembly according to the invention.

FIG. 2 illustrates an example of a power switching unit for a power switching assembly of a DC power supply system according to the present invention, in particular one that is suitable for use in high voltage DC systems. The DC power supply system of the present invention may be represented by the example of FIG. 1, with the bus tie switch 15 of FIG. 1 being replaced by a power switching assembly 122, or circuit breaker, of FIG. 3. The power switching assembly 122 is connected at terminals 28, 29 via mechanical breakers 127 on each side to DC bus sections 30, 31 of the DC main switchboards S1, S2. The power switching assembly 122, as illustrated in FIG. 3, comprises a plurality of power switching units 121, as illustrated in FIG. 2, connected together in series with a current limiter 100, typically an inductance, to form the power switching assembly 122 of FIG. 3.

The power switching assembly provides a high voltage modular DC bus tie switch based on power switching units 121 that are lifted electrically away from ground potential. The bus tie switch comprises a plurality of power switching unit modules, which may be easily added or removed according to the required topology for a particular application. Each power unit comprises an input 123 and output 124 between which is a first sub-unit circuit 146 comprising diode D1, semiconductor device Q1, typically a diode or transistor and capacitor C1 and a second sub-unit circuit 146 on the other side of symmetry line 125 comprising diode D2, semiconductor device Q2 and capacitor C2. Optionally, one, or each, sub-unit circuit may have a resistor R1, R2. Typically, the sub-units form part of a single power switching unit module, but alternatively, for example on an offshore platform, or vessel, where there are separate fire zones, the sub-units may be arranged to be in adjacent fire zones, coupled together by a DC connection between the two sub-units.

The sub-unit circuit 146 may have a resistor, or energy absorbing circuit 126a, 126b, or damper, such as a diode circuit to limit system oscillations and suppress voltage spikes, provided in series with the capacitor C1, C2. Alternatively, an energy absorbing, or damping circuit 149a, 149b may be provided in parallel with the capacitors. In some embodiments, both series and parallel damping circuits 126a, 149a, 126b, 149b may be provided. The, or each, damper 126a, 126b, 149a, 149b may comprise a series connected capacitor and resistor, or a series connected inductor and resistor, which may be connected in parallel with a transistor, or diode; or a series connected capacitor and diode, with a resistor in parallel with the capacitor. The optional damper 126a, 126b, 149a, 149b in series, or parallel, with capacitors C1, C2 may be implanted as part of the design of the semiconductor device. Diodes D1, D2 may be implemented as freewheeling diodes in a transistor.

The transistor or diode circuits Q1, Q2 conduct current when the circuit breaker 122 is in the ON state. If a short circuit occurs on one side of the power switching assembly 122, then the external current limiter 100 limits the short circuit derivative, rate of change of current, di/dt and when the breaker opens, in each of the units 121 in series in the assembly 122, the transistor diode circuit Q1, Q2 turns off. As long as the short circuit is outside the power switching unit, the inductance will always be in series with the short circuit irrespective of which side the inductor is connected in the topology.

Although only shown on one side of the circuit in FIG. 3, an external current limiter 100 may be provided on either side, or on both sides of the series of power switching units 121, between the first unit and side 1 and between the last unit and side 2. One of the capacitors C1, C2 blocks the voltage when one, or both, of the transistors Q1 and Q2 are turned off. The optional resistor R1, R2 provides damping of the LC oscillation circuit formed by both internal and external inductance in the circuit, when the transistors are turned off and also limits the capacitor discharge current when Q1, Q2 turns on. The optional resistors may be implemented as internal serial resistance in the capacitors C1, C1 or external resistors R1, R2. The inductance in the oscillation circuit is typically the sum of the inductance of the external current limiter 100 and the stray inductance in the full series of units connected from the closest voltage source or capacitor bank, as illustrated in more detail in FIG. 4.

Typically, a plurality of units 121 are connected together in series as in FIG. 3 and then connected into the power supply system between the DC buses 30, 31 on the two sides of the DC main switchboard S1, S2 of FIG. 1. Any number of serial connected units, as indicated by U1, U2 . . . Un may be used, where Un may be an infinite unit number. Mechanical switches 127 are provided at side 1 and side 2 of the positive and negative poles and these switches provide galvanic separation between the two sides of the power switching assembly 122 to block stray currents from being transmitted from one side to the other. The current limiter, inductance, –L, may be placed on either side 1 or side 2, as shown, or on both sides. Providing the inductance outside the power switching units reduces cost and complexity in each unit, by replacing multiple components with only one or two components. This is particularly beneficial where large numbers of series units are connected. The units may be connected in positive or negative potential, or both. An optional capacitance 148 may be connected across the poles of the assembly 122 on either or both of side 1 and side 2 to protect the power switching units under certain conditions. The capacitance 148 may be either before or after the current limiter 100. An optional resistor (not shown), or damper circuit (not shown) of the type described with respect to FIG. 2 may be added in series with the capacitance 148.

Figure 4:
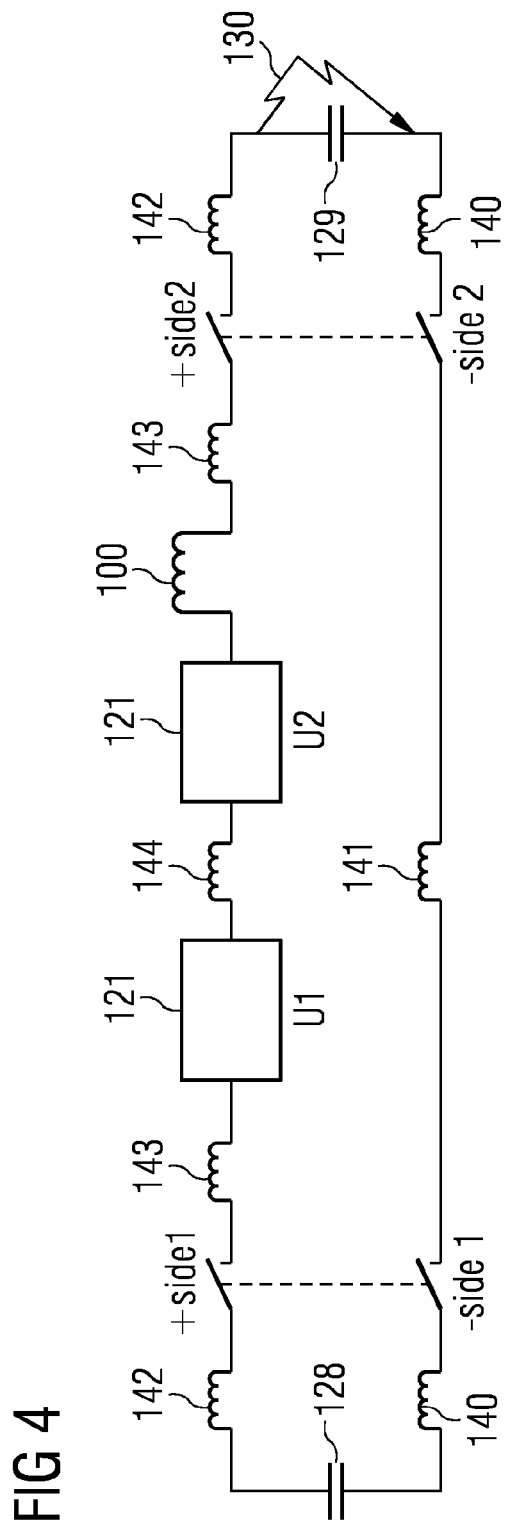
FIG. 4 is an electrical equivalent circuit for the power switching assembly of FIG. 3.

FIG. 4 illustrates an electrical equivalent circuit of the power switching assembly of FIG. 3, for a power switching assembly according to the invention comprising power switching units 121, as illustrated in FIG. 2. On the negative pole, there is stray inductance 140 at side 1 and side 2, as well as stray inductance 141 between the mechanical switches 127. On the positive pole, there is stray inductance 142 at side 1 and side 2, as well as stray inductance 143 between the mechanical switches 127 and each of the power units 121 and also stray inductance 144 between the two power units. The current limiter 100 is modelled as inductance. The input 128 from side 1 and the input 129 from side 2 are treated as a large capacitor or voltage source. In the event of a failure on side 1 or side 2 of the DC power supply system, such as a short circuit 130, shown in this example on side 2, there is no interruption to the stable voltage on the other side of the system, in this example, side 1.

Figure 5A:
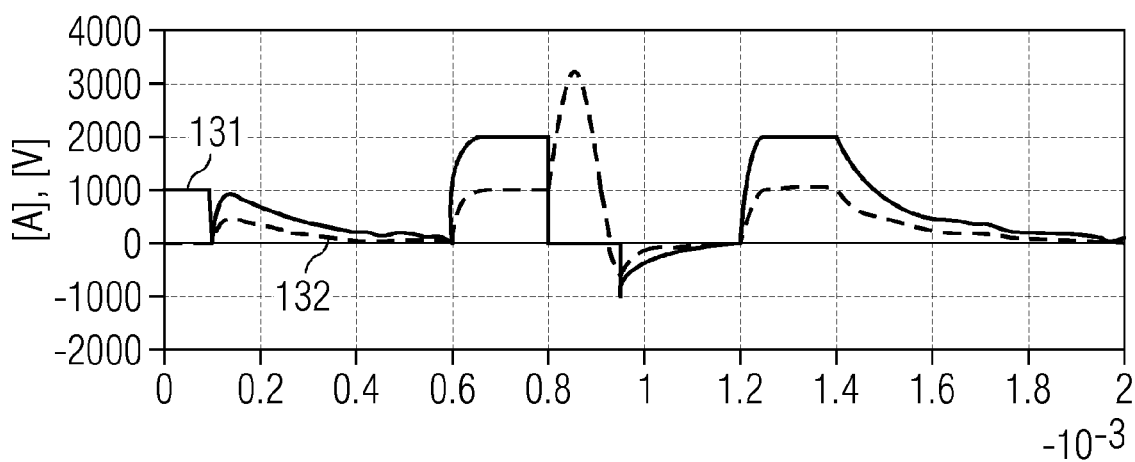
FIG. 5*a* illustrates current and voltage curves against time, for the example of FIG. 3.
Figure 5B:
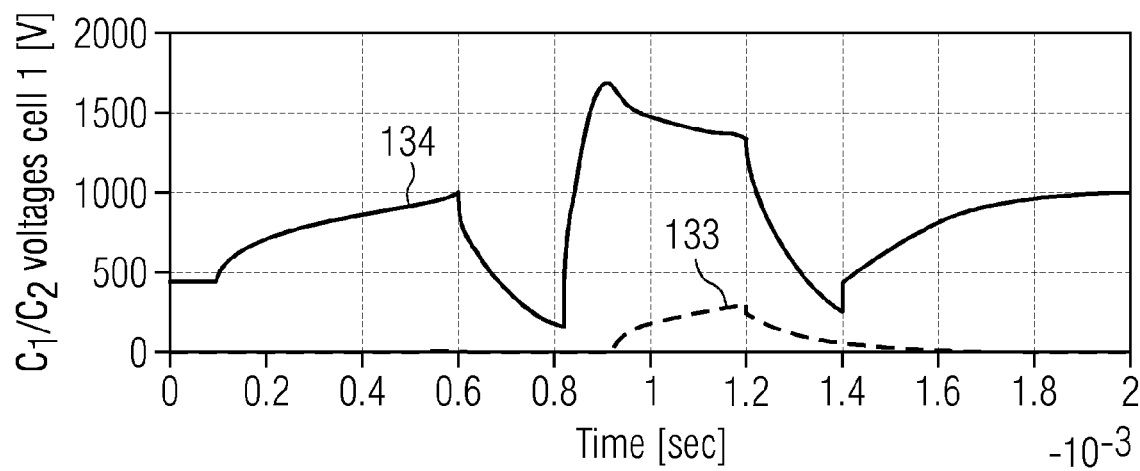
FIG. 5*b* illustrates voltage at capacitor C1 or C2 against time, for the example of FIG. 3.

An example of current and voltage from a simulation of a power switching assembly 122 having two power units 121 connected in series and a 2 kV DC voltage source on side 1 is shown in FIGS. 5a and 5b. In FIG. 5a, curve 132 represents the variation of current on side 2, with time, the side with the fault, or failure and curve 131 represents the variation of DC voltage on side 2, with time. FIG. 5b shows the voltage on the power unit itself. Curve 133 represents DC voltage across capacitor C1 in the power unit 21 and curve 134 represents the DC voltage across capacitor C2 in power unit. The voltage build up is the same for all the units 121, as they are in series.

Initially, the circuit breaker is open and the voltage 131 is high on side 2 due to transistor/diode leakage impedance. There is no current 132 on side 2 and no DC voltage 133 in the capacitor C1 of power unit U1, as capacitor C1 has not been charged. The voltage 134 across C2 starts a little below 500V, as capacitor C2 in this example, is already charged. At time 0.1 ms, a 2 MW load is connected, the breaker is still open, but on side 1 the capacitors in the power unit 121 charge to ½ of the full voltage source each, i.e. 1000V, as there are two units in series. DC voltage 131 drops to zero, then starts to rise again for a short period and tails off to zero by time 0.6 ms. Current 132 on side 2 rises initially, then tails off to zero by time 0.6 ms. Voltage 134 across capacitor C2 rises to nearly 1 kV at time 0.6 ms, but voltage 133 across C1 remains at zero.

At time 0.6 ms, the effect of the circuit breaker closing is illustrated, so the voltage 134 in the capacitor banks drops according to the unit inductivity and capacitor serial resistor. Voltage 133 remains at zero until about 0.95 ms. Voltage 131 and current 132 on side 2 both rise initially, then level off. At time 0.80 ms a short circuit on side 2 is illustrated causing a drop in voltage 131 on side 2 to zero and causing a spike in current 132 on side 2 to above 3 kA. At time 0.82 ms, the breaker opens, the control system detects the short circuit and opens the transistors and the voltage 134 peaks above 1500 V at about 0.9 ms, then begins to drop again. The current 132 on side 2 starts to drop falling below zero by time 0.95 ms and the voltage 131 remains at zero. At time 0.95 ms the short circuit is cleared and the breaker opens, current 132 begins to climb again and voltage 131 drops instantaneously to −1.1 kV, then starts to climb again towards zero by time 1.2 ms. Voltage 134 across capacitor C2 continues to drop and voltage 133 starts to rise. At time 1.20 ms, the breaker closes, the load is still connected and the capacitors in the units discharge. The current 132 and voltage 131 on side 2 rise and level off, whilst both voltages 133, 134 drop. At time 1.4 ms, the breaker opens, the voltage 134 climbs and the capacitors in the units charge. Current 132 and voltage 131 drop toward zero.

FIG. 6 is a flow diagram showing an example of a method of operation of a DC power switching assembly according to the invention. A load may be connected 50 to the circuit and the bus tie switches of the power switching assembly 122 are set to be closed 51, for normal operation. A system controller (not shown) monitors 52 system voltage and current during operation. Upon detection 53 of a short circuit on one side of the power switching assembly 122, the controller causes the breakers to open 54 and opens 55 the transistor diode circuitry within each sub-unit to block current, or voltage. After the cause of the short circuit has been removed 56 and cleared, the system may close 57 the breaker again, closing the transistor diode circuit of the relevant sub-unit to allow current or voltage again and normal operation is resumed 58, with the system controller continuing to monitor 52 current and voltage to determine if another short circuit occurs.

The circuitry of the present invention provides a static DC circuit breaker that may be used for any DC voltage level based on generally available components and in particular for medium and high voltage levels, i.e. above 1000V, in the range 1 kV to 10 kV, in the range 1 kV to 15 kV, or even above 15 kV. Although, the examples have been given for two series connected power switching units, for any required voltage, a number of power switching units in series is chosen to make up the power switching assembly by splitting the total voltage requirement substantially equally across all the units, taking account of the voltage at which each unit is rated to operate. The currently advantageous voltages are around 10 kV to 15 kV, but the modular approach enables operation at up to 100 kV to be achieved by adding further units.

The invention claimed is:

1. A DC power supply system comprising:
   first and second DC power distribution bus sections and a DC power switching assembly comprising a plurality of series connected power switching units and a current limiter;
   each power switching unit comprising a first power switching unit terminal and a second power switching unit terminal and two symmetrical power switching sub-units to control current flow between the first terminal and the second terminal;
   each sub-unit being electrically connected on one side to one of the first and second power switching unit terminals and on the other side to the other sub-unit;
   wherein the power switching sub-units each comprise a semiconductor device and in parallel with the semiconductor device, a series connected diode and capacitor;
   wherein a first terminal of the assembly is electrically coupled to the first bus section of the power distribution bus and the second terminal is electrically coupled to the second bus section of the power distribution bus; and
   wherein the voltage at one side of the power switching assembly is greater than or equal to 1 kV.

2. The system according to claim 1, wherein the current limiter comprises an inductance.

3. The system according to claim 1, wherein the current limiter is provided between each of the first and second terminals and an adjacent power switching unit.

4. The system according to claim 1, wherein one or each of the sub-units further comprise a resistor in series with the capacitor.

5. The system according to claim 1, wherein one or each of the sub-units further comprise a damping circuit in series with the capacitor.

6. The system according to claim 1, wherein the semiconductor device comprises one of a diode, or a transistor.

7. The system according to claim 1, wherein the semiconductor device comprises an insulated gate bipolar transistor.

8. The system according to claim 1, wherein the voltage at one side of the power switching assembly is within the range 1 KV to 10 KV.

9. A method of operating a DC power supply system according to claim 1; the method comprising:
monitoring system voltage and current during operation for an indication of a short circuit;
upon detection of the indication of the short circuit, opening the power switching units to block current from the short circuit side of the system;
monitoring for an indication that the short circuit has been cleared, and upon detection of the indication that the short circuit has been cleared, closing the power switching units to allow current to pass through the power switching units; and
continuing to monitor the system for the indication of a short circuit.

* * * * *